March 28, 1967 T. D. GEISZLER ET AL 3,311,812

BROADBAND SOLID STATE MICROWAVE ENERGY SOURCE

Filed July 9, 1964 2 Sheets-Sheet 1

INVENTORS
Theodore D. Geiszler
Henry D. Elifritz
BY Glenn S. Ovrevik
AGENT

BROADBAND SOLID STATE MICROWAVE ENERGY SOURCE

Filed July 9, 1964 2 Sheets-Sheet 2

INVENTORS
Theodore D. Geiszler
Henry D. Elifritz
BY
Glenn S. Ovrevik
AGENT

United States Patent Office 3,311,812
Patented Mar. 28, 1967

3,311,812
BROADBAND SOLID STATE MICROWAVE ENERGY SOURCE

Theodore D. Geiszler and Henry D. Elifritz, Santa Clara, Calif., assignors to Western Microwave Laboratories Inc., Santa Clara, Calif.
Filed July 9, 1964, Ser. No. 381,455
11 Claims. (Cl. 321—69)

The invention relates in general to microwave energy sources and in particular to energy sources of the solid state variety.

The notable advantages of operation at microwave frequencies in communication and radar applications are well recognized and a wide variety of microwave energy sources have been devised for use in these applications and the other applications, as well. For example, complex and bulky cavity structures, energized by the application of a voltage thereacross have been used extensively in applications where size is not a critical requirement. More often than not, the power supply required to energize these cavity structures is relatively large and heavy, as well. In microminiature microwave systems it has been necessary, of course, to employ more compact means for the generation of microwave energy. In such applications, compact klystrons, ceramic triodes, magnetrons, etc., have been employed with some degree of success. Foremost among miniature microwave energy sources, however, has been the variety which utilizes a solid state oscillator as its reference frequency source and is followed by a series of cascade connected harmonic generators, each tuned to a multiple of the output of its input connected generator. In such solid state systems of the prior art, the oscillator normally operates at a relatively low frequency, 60 to 200 mc., for example, and the multiplication stages which follow are constructed utilizing mechanical harmonic generator techniques. Frequently, as many as five or six steps of multiplication are employed, depending upon the output frequency desired. Such systems require complicated tuning networks between each stage of multiplication and as a consequence prior art devices of this type are difficult to adjust and are inherently narrow band.

Moreover, in this type of prior art device the noise output is extremely high since each stage of multiplication increases the noise by its multiple factor. In general, solid state microwave sources have been found to be useful in applications involving narrow band, low power, minimum frequency variation requirements, but have been found to be basically unsuitable for low noise applications over a band of frequencies.

Efforts have been made to package the solid state source described above in a relatively small assembly but this has been accomplished only by a considerable sacrifice of frequency band width. Obviously, such packaging entails precise manufacturing techniques, requiring highly skilled craftsmen and, as a consequence, the overall expense is greatly increased as package size is reduced.

It will be appreciated that a compact microwave energy source possessing advantages over the prior art in terms of weight, power consumption, life expectancy and greater operating frequency band capabilities is needed and would be welcomed as a substantial advancement of the art.

Accordingly:

It is an object of this invention to provide a solid state microwave energy source of relatively small size.

It is another object of this invention to provide a solid state microwave energy source which is characterized by a high D.C. to R.F. conversion factor.

It is a further object of this invention to provide a microwave energy source which is mechanically tunable over a band of frequencies.

It is still another object of this invention to provide a microwave energy source which is electronically tunable over a band of frequencies.

It is an additional object of this invention to provide a solid state microwave energy source having exceptional frequency stability.

It is still another object of this invention to provide a solid state microwave energy source which utilizes a minimum number of active components.

It is a further object of this invention to provide a microwave energy source which may be tuned over either narrow or broad bands of frequencies.

Other objects of this invention will become apparent upon a more comprehensive understanding of the invention for which reference is had to the following specification and drawings wherein.

Figure 3:
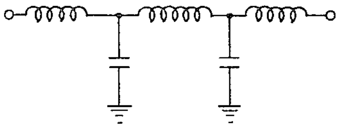
FIGURE 3 is a schematic showing of one variety of slow wave filter suitable for use in the embodiment of FIGURE 1.
Figure 4A:
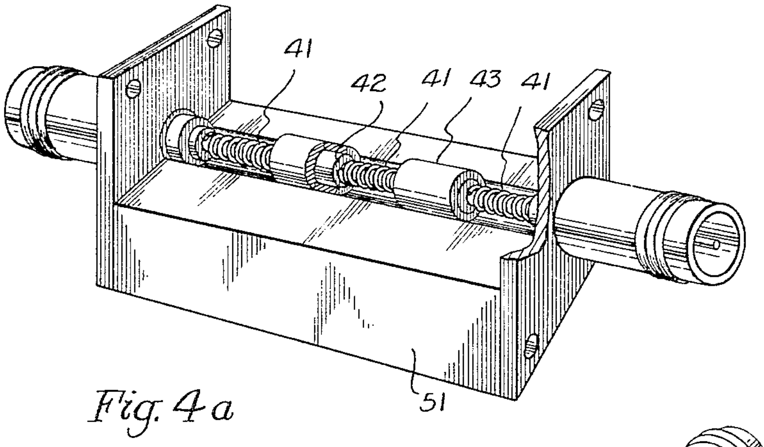

FIGURE 4*a* is a pictorial showing of one embodiment of the variety of slow wave filter shown in schematic form in FIGURE 3.

Figures 4B, 5:
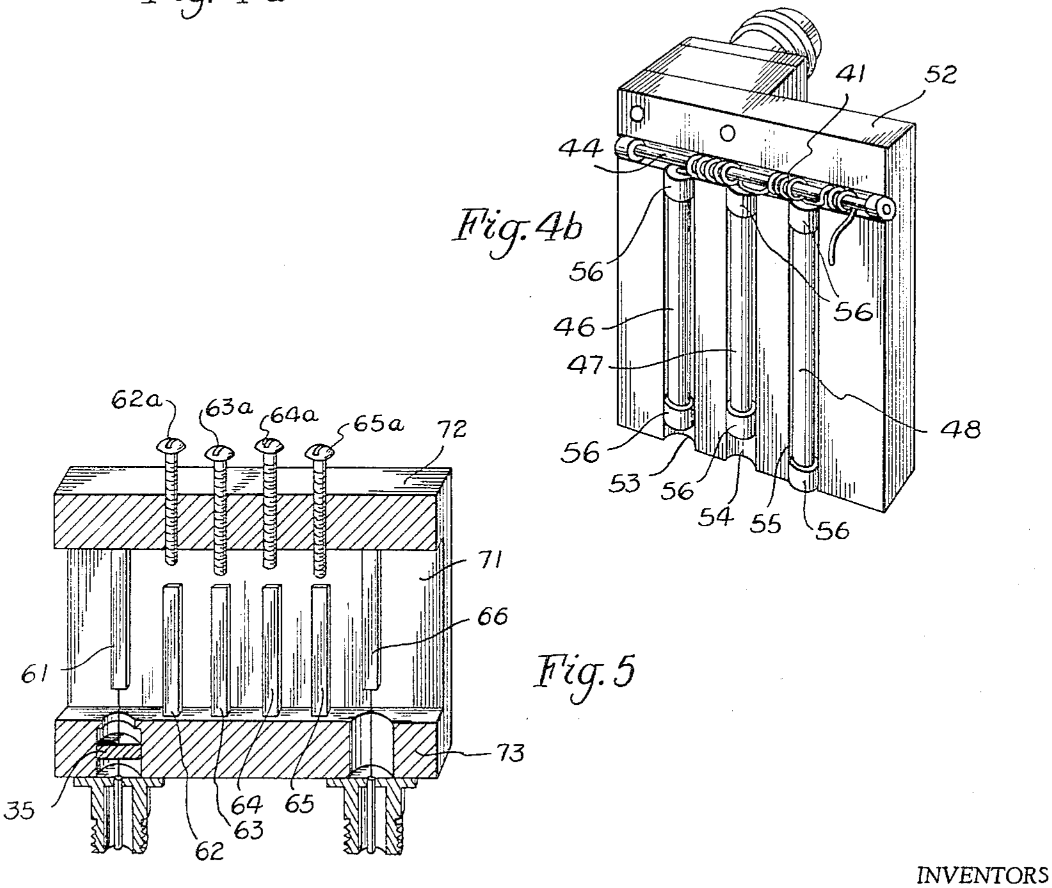

FIGURE 4*b* is a pictorial showing of another embodiment of the variety of slow wave filter shown in schematic form in FIGURE 3.

Figure 1:
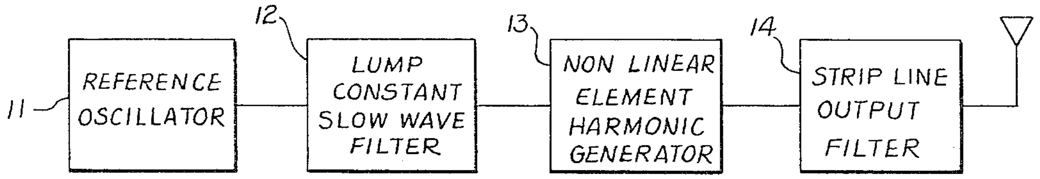
FIGURE 1 is a block diagram showing of one embodiment of this invention.
Figure 2:
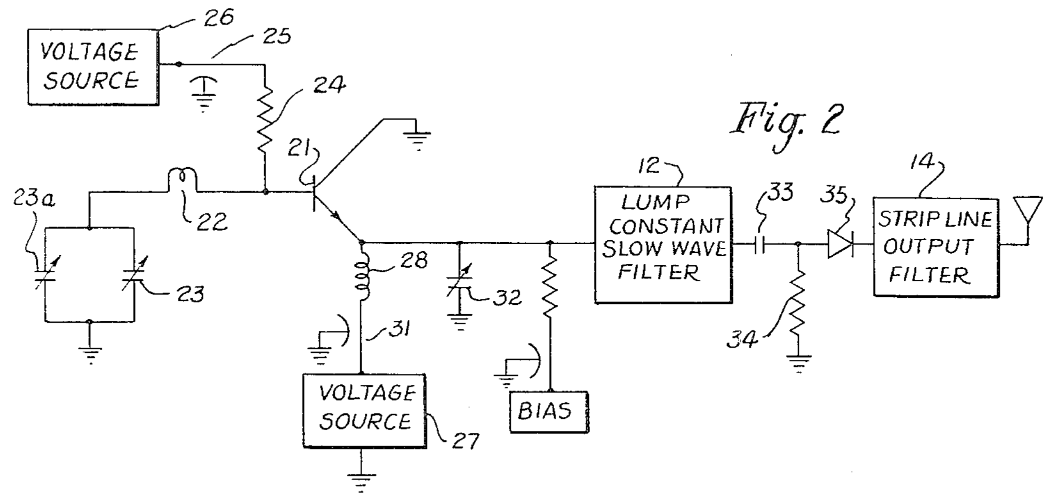
FIGURE 2 is a more detailed schematic and block diagram showing of the embodiment of FIGURE 1.

FIGURE 5 is a showing of a typical strip line interdigital comb-line output filter suitable for use in the embodiment of FIGURES 1 and 2.

Figure 6:
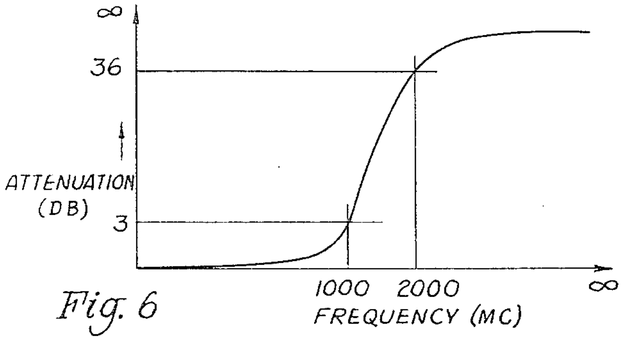

FIGURE 6 depicts a characteristic curve for a lump constant low pass filter of the variety shown in block diagram in FIGURES 1 and 2.

Figure 7:
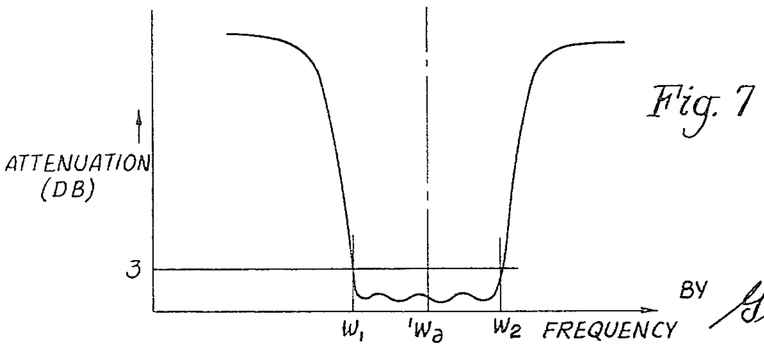

FIGURE 7 depicts a characteristic curve for a lump constant strip line bandpass output filter of the variety shown in block diagram in FIGURES 1 and 2.

Briefly, the device of this invention is a solid state microwave energy source which equals the prior art klystron in terms of efficiency, reliability, and stability and does so with a substantial reduction in size requirement and with a greater range of tuning. The reference oscillator of the device of this invention is adapted to operate at relatively high frequencies and the output thereof is processed through a unique lump constant assembly of selected elements such that a low noise microwave signal which is readily tunable over a band of frequencies in the 1 to 16K mc. range is obtained. The solid state microwave source of this invention may be adapted for either mechanical tuning with electronic trimming, or for completely electronic tuning.

Referring now to the drawings in more detail:

FIGURE 1 shows one embodiment of the device of this invention in a basic assembly which affords the notable performance per size advantages of the device. More particularly, the reference oscillator 11 may be a compact transistor oscillator adapted to oscillate at 550 mc., for example, connected to a slow wave input filter 12 which preferably is of the lump constant variety shown in FIGURES 3 and 4*a* and *b* or the equivalent. It will be appreciated, of course, that the input filter 12 may be either a bandpass or a low pass filter in selected circumstances.

The output of the slow wave, lump constant, input filter 12 is, in turn, connected to a non linear element harmonic generator 13 which may be of the step recovery diode variety as shown in more detail in FIGURE 2. In accordance with the teaching of the present invention, the step recovery diode is directly connected, electrically and physically, to the input of a strip line bandpass output filter 14 of the interdigital-combline variety shown in FIGURE 5. As will be discussed in detail hereinafter, the basic lump constant concept of the device of this invention necessitates a precise assembly of the several parts of the device. In particular, the physical relation of the step recovery diode to the strip line bandpass output filter structure is critical to the operation of this embodiment of the microwave device of this invention as a lump constant device.

FIGURE 2 is a partial schematic of the embodiment of FIGURE 1. In the schematic showing of the oscillator 11, a transistor 21, which may be an NPN silicon device such as an RCA TA 2307, is connected at its base to a first selected voltage point, in this instance ground potential, via a series resonant circuit inductance 22 and variable capacitance 23 with capacitance 23*a* in shunt with capacitance 23 for trimmer purposes. Also as shown, the base of transistor 21 is connected via current limiting resistance 24 and coax connector 25 to a second selected voltage point, as determined by voltage source 26 such that voltage tuning over a 1.5 percent range is permissible.

With the collector terminal of the transistor 21 connected to the first selected voltage point, ground, the output of a second voltage source 27 is applied to the emitter terminal thereof via inductance 28, which together with the capacitance of the coax connector 31 in series and the variable capacitance 32 in shunt forms a series parallel output tank circuit for the oscillator 11. It will be appreciated, of course, that the oscillator 11 may take other forms than that exemplarily shown in FIGURE 2. For example, a terminal other than the collector terminal of the transistor 21 may be grounded, if desired. For the depicted embodiment with an oscillator frequency of 550 mc. the following component values might be employed in a typical case:

Inductance 22—1 turn.
Capacitance 23—8–10 $\mu\mu$fd.
Capacitance 23*a*—5.1 $\mu\mu$fd.
Resistance 24—3.9K ohms.
Inductance 28—2 turns.
Capacitance 32—8–10 $\mu\mu$fd.

Adjustment of output frequency for the oscillator 11 is obtained either by varying capacitances 23 and/or 32 or by changing the voltage output of the voltage source 26 which might be in the range $\pm 5$ volts. It will be appreciated that in the depicted embodiment, the voltage source 26 effectively determines the transistor 21 base current and that the variable capacitances 23 and 32 each control the resonant frequency of their respective tank circuits. It is understood, of course, that it is within the purview of this disclosure to control the transistor base current and the resonant frequency of the tank circuits by any suitable voltage or impedance adjustment.

The output of oscillator 11 is applied via lump constant slow wave input filter 12 having a bandpass characteristic as shown in FIGURE 6 across capacitance 33, which may be .2–5 $\mu\mu$fd., for example, and resistance 34, which may be 8.2K ohms, to ground such that the D.C. component of the wave energy passing through the input filter 12 affords a bias to the non-linear reactance device, 35, which may be a variable capacitance semiconductor device such as a step recovery diode.

The non-linear characteristic of the step recovery diode 35 is operated in conventional fashion more particularly, within its reverse saturation region so as to avoid both forward conduction and avalanche breakdown. Operated in this manner, the step recovery diode 35 provides a low order harmonic of the input signal, for example the fifth, and this is obtained with a relatively high conversion efficiency.

As shown in the drawing, the output of the step recovery diode 35 is applied to an output filter 14 which preferably is of the strip line interdigital combline variety. It will be appreciated, of course, that a wide variety of devices having a non-linear reactance characteristic may be employed for harmonic generation purposes in this invention. It has been found, however, that solid state devices having a non-linear reactance characteristic are especially adaptable and that step recovery diodes, in particular afford notable advantages of size and cost as well as performance. For example, a step recovery diode of the type commercially available from Hewlett-Packard Associates and identified as HPA–0111, may be employed. Such a step recovery diode may have a transistion time of 150 picoseconds and a lifetime in the order of 50 nanoseconds. It will be appreciated that voltage on the step recovery diode is necessary for optimization of the desired harmonic and that this may be established by either a resistance to ground (self bias) or a separate bias input circuit in which a desired voltage is injected from an outside supply.

The strip line interdigital combline output filter 14 is adapted to provide a relatively wide bandpass, for example an octave, with strong stop bands, the next pass band centered, in one embodiment, at three times the center frequency of the utilized pass band. Moreover, the strip line interdigital combline filter can be provided in a very compact assembly with relatively non critical manufacturing tolerances. This variety of output filter will be discussed in more detail hereinafter with reference to the showing of FIGURE 5. It will be appreciated, of course, that while strip line filters of the interdigital combline variety afford many advantages and this type of filter is preferred in the exemplary embodiment of this invention, other types of lump constant bandpass filters having significant stop bands may be utilized in selected applications, if desired.

A typical bandpass characteristic of a strip line filter of the interdigital variety is shown in FIGURE 7. In this showing, a bandwidth of 400 mc. centered at 3K mc. is depicted with $w_0 = (2\pi)3 \times 10^8$
$w_1 = (2\pi)2.8 \times 10^8$
$w_2 = (2\pi)3.2 \times 10^8$ FIGURE 3 shows a typical circuit diagram of a lump constant slow wave input filter as indicated at 12 in FIGURES 1 and 2. It has been found that slow wave filter techniques may be adapted to microwave structures and that the resultant assembly affords numerous advantages in miniature applications.

FIGURE 4*a* shows one slow wave microwave filter which is suitable for use in this invention. In the embodiment of FIGURE 4*a*, the inductances, indicated at 41, are electrically connected in series with metallic sleeve sections indicated at 42, intermediate each inductance and both the inductances and the sleeves are mounted on a support rod of suitable material such that the inductances and sleeves are disposed in alignment on a common axis. A capacitance bead, 43, of a selected dielectric material surrounds each metallic sleeve and the entire assembly may be contained in a drilled metal block 51 which might be, for example, 1″x½″x½″ or smaller.

FIGURE 4*b* shows another slow wave microwave filter which is suitable for use in this invention. In this embodiment, the inductances 41 are electrically connected in series and are mounted on a suitable support rod, indicated at 44, which serve to isolate the inductances 41 from the drilled block structure, 52. The capacitance connected between the inductances 41 comprise metal rods, indicated at 46, 47 and 48, of selected length and diameter which are housed within respective drillings of the block structure, indicated at 53, 54 and 55, respectively, and are disposed in the center by means of spacers 56. It will be appreciated, of course, that it is not essential that round metal rods be utilized, as shown, and that rods of other cross section would be suitable in selected applications. Moreover, the capacitance bead assembly of FIGURE 4*a* and the capacitance stub assembly of FIGURE 4*b* are merely illustrative of two possible filter configurations which are adaptable to the compact microwave energy device of this invention. It will be appreciated that the selection of either of the two or of any other slow wave structure, not shown, is dependent upon the physical and electrical requirements of the microwave source.

FIGURE 5 shows an output filter of the strip line interdigital comb line variety adaptable for use in the device of this invention. In the depicted embodiment, a comb line band pass filter with TEM mode transmission line elements 61, 62, 63, 64, 65 and 66 are housed within a flat strip line structure having a bottom plate 71, two side sections, 72 and 73 and a top plate, not shown. In accordance with conventional comb line band pass filter design as described by George L. Matlhaei in the Microwave Journal, August 1963, pages 82–91, the transmission line elements 62, 63, 64 and 65 are shorted at one end and each has a lumped capacitance $C_k s$ between the other end of each resonator line element and ground. The number of resonators may vary in selected applications, of course, and coupling between resonators is achieved by means of fringing fields between resonator lines. With the lumped capacitance $C_k s$ present, the resonator lines 62, 63, 64 and 65 are less than $\lambda o/4$ long at resonance (where $\lambda o$ is the wavelength in the median of propagation at the center frequency of the band) and the coupling between resonators is believed to be predominately magnetic. It will be noted that the tuning screws 62*a*, 63*a*, 64*a* and 65*a* are provided for fine tuning purposes and may be omitted in selected applications. As is recognized by those skilled in the art, some kind of reactive loading at the end of the resonator line elements is required to insure that the magnetic and electric coupling effects do not cancel each other whereby the assembly would become an all stop structure. It is usually desirable to make the capacitances $C_k s$ in this type of filter sufficiently large so that the resonator lines will be $\lambda o/8$ or less long at resonance. Besides permitting efficient coupling between resonators, this, of course, reduces the over-all size of the filter.

The second pass band in this variety of filter occurs when the resonator line elements are somewhat over one-half wavelength so that if the resonator lines are $\lambda o/8$ long at the primary pass band, the second pass band will be centered slightly over four times the frequency of the center of the first pass band. If the resonator line elements are made to be less than $\lambda o/8$ long at the primary pass band, the second pass band will be even further removed from the primary pass band.

Another property of this type of filter is that, in theory, the attenuation through the filter will be infinite at the frequency for which the resonator lines are one-quarter wavelength long. Because of this property, the attenuation above the primary pass band will be very high and, depending on what electrical length the resonator lines have at the pass band center, the rate of cutoff on the upper side of the pass band can be made to be unusually steep. (The closer to $\lambda o/4$ long the resonators are at the pass band center, the steeper the rate of cutoff will be above the pass band.)

The end transmission line elements 61 and 66 generally are not considered as resonators but rather as simple impedance transforming sections at the ends of the filter. In the device of this invention, however, the step recovery diode provides a reactive loading to the input element and the input element 61 not only serves as an impedance transforming section but as a part of the resonator system as well. In accordance with the teaching of this invention, the step recovery diode 35 is disposed within a side or ground plane section of the output filter in a drilled cavity adapted to receive same such that the electrical length requirements of the resonator lines are met and the tuning screws 62*a*, 63*a*, 64*a* and 65*a* are adjusted as necessary to obtain the desired performance characteristic. In this harmonic generator-strip line output filter relation, it has been found that these two elements may be given a lump constant consideration over the selected band of frequencies.

It will be recognized that the solid state harmonic generator which introduces a capacitive reactance in the input element section of the filter may be physically disposed with respect the end transmission line element in several different orientations and that the orientation shown in FIGURE 5 is merely examplary.

Moreover, it is not essential to the device of this invention that the solid state capacitive reactance means in the input element section of the strip line filter be a secondary high frequency source as in the illustrated embodiment. That is, it is within the purview of this disclosure to incorporate solid state devices which may be energized to generate high frequencies by any means D.C. or A.C., conventional or otherwise. Thus, the function of the solid state oscillator and the solid state harmonic generator in the exemplary embodiment may be effectively or actually consolidated into one solid state element and this consolidated solid state element may be utilized to introduce a capacitive reactance in the input element section of the output filter.

Likewise, it will be appreciated that interdigital and comb line filters are substantially similar in operation and each has individual characteristics which render it preferable over the other in selected applications. For example, comb line filters may be constructed more compactly and are capable of a proader stop band above the primary pass band. On the other hand, for the same cross-sectional dimensions of the resonator lines, the interdigital filter may have a higher Q than a comparable size comb line unit. It is readily apparent that these two types of filters are substantially interchangeable in the device of this invention.

The device of this invention has been proved operable anywhere in the 850 mc. to 16K mc. range. For example, it has been found that an L-band device which operates in the frequency band 1050 to 1150 mc., has a power output of at least 15 mw., when powered by +12 and −4 volts at a current drain of 50 milliamps.

As described herein the device of this invention can be mechanically tuned, electrically trimmed, or completely electrically tuned. Power output levels are adjustable from 1 milliwatt to 500 milliwatts within selected frequency ranges. The electronic tuning range, when mechanically set is at least 10 times greater than that of a comparable klystron. This characteristic permits an exceptionally large FM information bandwidth. The D.-C to R.-F. conversion efficiency varies between 5 and 3[illegible] percent depending on the output frequency range. Values of 20 percent are typical for 3K mc. operation.

In the exemplary embodiment, power supply requirements are generally +22 volts and −10 volts at 10–10[illegible] milliamps of current. These are again dependent on the frequency range and output power levels. It will be appreciated that because of the low voltage and low current requirements the power supply for the device of this invention can be made exceptionally small and at low cost. To illustrate, a typical power supply with the required degree of regulation and stability will occupy approximately 2 to 8 cubic inches. Furthermore the device may be completely solid state requiring no heater or filament power.

In addition to its many other electrical features, the device of this invention is characterized by exceptional stability. Stabilities on the order of 1 to 4 parts in 10[illegible] have been measured using WWV as a reference. The significance of this stability is realized when compared with a klystron coupled to a stalo which affords a stability factor of only 5 parts in $10^6$.

As will be appreciated, a wide variation in mechanical configurations and sizes is possible. In general, the higher power or broader band units will require the largest volume. A typical 3K mc. device may be approximately ½" x 2" x 3". Miniaturized models have been con-:ructed which provide approximately 25 milliwatts of utput power and occupy a total space of only 1½ cubic ıches. Weights will vary anywhere from several ounces ) 16 ounces depending on the materials used and power :quirements of the device.

Life expectancy of the device of this invention as in-icated by an analysis of individual components is ex-emely long term, a mean-time-between-failures of at ast 10,000 hours is not an unrealistic appraisal. The ltimate reliability, of course, will be solely dependent n the quality of the semi-conductor elements employed. Moreover, the exemplary embodiment performs excep-onally well in extreme shock and vibration tests due in ırge measure to its all solid-state construction. It is articularly signilcant that no shock noise or FM is in-uced at the output when it is subjected to severe changes ı dynamic loading. The exemplary embodiment has erformed satisfactorily to 80° C. with a 10 percent power utput degradation with almost no change in frequency r long term stability.

The device of this invention permits many new micro-ave system concepts to be implemented. It also per-ıits existing systems to be significantly upgraded. For xample, the most obvious uses are for the replacement f klystrons and triodes in local oscillator applications. ı this area it is characterized by better efficiency and, ost important, greatly improved stability with a very inimum of power supply requirements. It will be ap-reciated that the high voltage, relatively high current ower supplies required for klystrons and triodes is a rawback in most systems since they are difficult to modu-te, costly, large, and not too reliable. Another advan-ge for this application is the reliability and life expect-ıcy which will be much greater than thermionic types f microwave sources. Its use as a lower power trans-itter is also obvious, for, in general, the same require-ents placed on local oscillators are true in this field. Likewise, the small size, power output, short and long rm stability obviously make the device of this invention ıeful in space and missile borne applications. It should : pointed out that all semiconductor elements may be licon or the equivalent which enhances the ultimate en-ronmental capabilities, reliability and operating life. s previously pointed out, the device of this invention quires no heater or filament power, thus the power pply can be made very small and completely solid state.

One of the important areas of high potential capability :s in counter-measures and counter-countermeasures ap-ications. The wide frequency capabilities and fre-ıency change agility of the invention makes it particu-rly attractive to these applications, especially when eight and power consumption advantages of the device e considered. Furthermore, the device of this inven-on has long range and long operating periods capabil-' which would be desirable in many applications of this ıture.

As was previously indicated, embodiments of the device ay have at least 1 percent tunability and some units ve as high as 10 percent electronic tuning capability. ıis, of course, means a large increase in information ndling capability compared to triode or klystron oscil-ors. This feature will find particular utility in the te-netry field. It permits information bandwidths 10 to times greater than that of presently available klystron urces used in FM systems with greatly improved sta-lity. With modification of circuitry within the purview this disclosure, the device can be made to accept easily M or pulse code modulation. Ease of modulation, FM, M, or PCM is of significant importance since there are ıny applications where size, weight and power require-ents of a klystron or triode oscillator limit their informa-n-carrying usefulness.

The low power consumption, small size and weight of : device of this invention and its associated power supply, now permits the first truly portable microwave system to be constructed. Applications from a test equipment standpoint are obvious, since the device can be used as a portable signal generator. This would be particularly helpful in field calibration and checkout equipment. Likewise, it can be used in system sensitivity measurements, antenna pattern measurements, etc.

A particularly interesting application is to be found in the portable microwave transceiver. Heretofore, these were not previously feasible because of power supply and modulation problems associated with R.-F. source. It has been found that a completely self-contained 3K mc. transceiver may be constructed in a structure comparable in size to a six cell flashlight. This size structure includes the antenna, transmitter, receiver, modulation and encoding circuitry and power supply.

Another valuable application of the device of this invention is in the field of radio or radar altimetry. The current state of the art altimeters generally utilize klystrons as the microwave power source. The klystron is FM modulated with the modulation deviation being controlled by a closed loop servo. Modulation deviation at all times is inversely proportional to altitude—the lower the altitude, the greater the deviation. Two major problems which exist in current altimeters are, (1) the inherent FM noise produced by microphonics in the klystron and, (2) the fundamental limitation of maximum deviation which can be obtained from the klystron. The device of this invention affords improvement in both areas—microphonics effectively do not exist since the device is solid state, and the deviation capabilities are considerably greater than that which can be obtained from a klystron. Thus, by incorporation of the device of this invention good low altitude capabilities in terms of FM deviation, as well as highest accuracy in high altitude environment due to the absence of microphonic FM noise may be obtained.

In summary, the device of this invention provides a compact, efficient, reliable and extremely stable solid state microwave signal source useful in many applications.

Finally, this invention is only to be limited by the scope of the claims appended hereto.

What is claimed is:

1. A microwave energy source for operation over a selected band of frequencies comprising a TEM mode bandpass filter of the variety including a plurality of transmission line elements disposed in parallel relation in a common plane between two ground planes wherein each of said line elements between end line elements in said plurality thereof, is grounded at one end and ungrounded at the other end with a predetermined capacitive reactance to ground at each ungrounded end, and said end line elements are adapted to function as impedance transformer means; high frequency oscillator means having a selected capacitive reactance over said selected band of frequencies electrically connected to one of said end elements and so disposed that said selected capacitive reactance is operative to alter the electrical length of said one of said end elements such that the last said end element will resonate in the vicinity of said selected band of frequencies; and means for varying the frequency of said high frequency oscillator means.

2. A microwave energy source as defined in claim 1 wherein said high frequency oscillator means incorporates solid state means having said selected capacitive reactance.

3. A microwave energy source as defined in claim 2 wherein said high frequency oscillator means incorporates an oscillator adapted to oscillate over a subharmonic band of frequencies and said solid state means in cascade connection and said solid state means is adapted to function as a harmonic generator.

4. A microwave energy source as defined in claim 3 wherein said oscillator adapted to oscillate over a subharmonic band of frequencies is of the solid state variety.

5. A microwave energy source as defined in claim 4 wherein said oscillator adapted to oscillate over a subharmonic band of frequencies is adapted for mechanical control of the output frequency thereof.

6. A microwave energy source as defined in claim 5 wherein said oscillator adapted to oscillate over a subharmonic band of frequencies is adapted for electrical control of the output frequency thereof.

7. A microwave energy source as defined in claim 2 wherein said solid state means is of the step recovery diode variety.

8. A microwave energy source as defined in claim 7 wherein said solid state means is disposed within the region defined by said ground planes.

9. A microwave energy source as defined in claim 2 wherein said TEM mode bandpass filter is a strip line filter of the interdigital-combline variety.

10. A microwave energy source as defined in claim 9 wherein said TEM mode bandpass filter is an interdigital strip line filter.

11. A microwave energy source as defined in claim 9 wherein each of said line elements intermediate end line elements incorporates means for varying said predetermined capacitive reactance.

References Cited by the Examiner

UNITED STATES PATENTS

| | | | |
|---|---|---|---|
| 2,954,468 | 9/1960 | Matthaei | 333—73 X |
| 3,177,378 | 4/1965 | Pulfer et al. | 331—76 |

JOHN F. COUCH, *Primary Examiner.*

G. GOLDBERG, *Assistant Examiner.*